(12) United States Patent
Cottet et al.

(10) Patent No.: US 9,024,421 B2
(45) Date of Patent: May 5, 2015

(54) CONNECTION ARRANGEMENT FOR SEMICONDUCTOR POWER MODULES

(75) Inventors: Didier Cottet, Zürich (CH); Gunnar Asplund, Solna (SE); Stefan Linder, Zofingen (CH)

(73) Assignee: ABB Research Ltd, Zurich (CH)

( * ) Notice: Subject to any disclaimer, the term of this patent is extended or adjusted under 35 U.S.C. 154(b) by 942 days.

(21) Appl. No.: 13/096,155

(22) Filed: Apr. 28, 2011

(65) Prior Publication Data

US 2011/0233608 A1 Sep. 29, 2011

Related U.S. Application Data

(63) Continuation of application No. PCT/EP2009/064256, filed on Oct. 29, 2009.

(30) Foreign Application Priority Data

Oct. 29, 2008 (EP) ..................................... 08167836

(51) Int. Cl.
*H01L 23/02* (2006.01)
*H01L 25/07* (2006.01)

(52) U.S. Cl.
CPC .................................. *H01L 25/072* (2013.01)

(58) Field of Classification Search
CPC ... H01L 29/739; H01L 21/00; H01L 23/4952; H01L 24/48
USPC .................. 257/777, 686, 678, 706, E23.051; 438/123, 238, 117, 122
See application file for complete search history.

(56) References Cited

U.S. PATENT DOCUMENTS

| | | | |
|---|---|---|---|
| 4,905,069 | A | 2/1990 | Shigekane |
| 5,444,295 | A | 8/1995 | Lake et al. |
| 5,635,757 | A | 6/1997 | Stockmeier et al. |
| 2008/0224323 | A1* | 9/2008 | Otremba ........................ 257/778 |

FOREIGN PATENT DOCUMENTS

| | | |
|---|---|---|
| EP | 0 669 653 A1 | 8/1995 |
| EP | 1 492 220 A | 12/2004 |

OTHER PUBLICATIONS

International Search Report (PCT/ISA/210) for PCT/EP2009/064256 dated Apr. 9, 2010.
Written Opinion (PCT/ISA/237) for PCT/EP2009/064256 dated Apr. 9, 2010.

(Continued)

*Primary Examiner* — Mark A Laurenzi
(74) *Attorney, Agent, or Firm* — Buchanan Ingersoll & Rooney PC

(57) ABSTRACT

A semiconductor power module includes at least two sub modules. The sub modules include at least one respective transistor having a collector, an emitter, and a gate. The module includes a connection arrangement having a collector terminal unit for connecting the collectors of the at least two sub modules collectively to external circuit components, at least two emitter terminal units for connecting the respective emitters of the at least two sub modules individually to external circuit components, and at least two gate terminal units for connecting the respective gates of the at least two sub modules individually to external circuit components.

24 Claims, 9 Drawing Sheets

(56) References Cited

OTHER PUBLICATIONS

European Search Report for EP 08167836 dated Oct. 7, 2009.
Notification Concerning Transmittal of International Preliminary Report on Patentability (Forms PCT/IB/326 and PCT/IB/373) and the Written Opinion of the Searching Authority ( Form PCT/ISA/237) issued in the corresponding International Application No. PCT/EP2009/064256 dated May 12, 2011.

* cited by examiner

CONNECTION ARRANGEMENT FOR SEMICONDUCTOR POWER MODULES

RELATED APPLICATIONS

This application claims priority as a continuation application under 35 U.S.C. §120 to PCT/EP2009/064256, which was filed as an International Application on Oct. 29, 2009 designating the U.S., and which claims priority to European Application 08167836.9 filed in Europe on Oct. 29, 2008. The entire contents of these applications are hereby incorporated by reference in their entireties.

FIELD

The present disclosure relates to semiconductor power modules, such as connection arrangement for controlling large currents in an electronic circuit arrangement, and for connecting power modules to external circuit components.

BACKGROUND INFORMATION

Semiconductor power modules are known to include IGBTs (Insulated Gate Bipolar Transistors). As the ampacity of a single IGBT is limited, a plurality of IGBTs are connected in parallel within the semiconductor power modules. Due to asymmetric DC paths, stray inductances, complex electromagnetic coupling effects, and current imbalance between the parallel IGBTs may occur. Such a current imbalance may lead to insufficient semiconductor power module ratings.

SUMMARY

An exemplary embodiment is directed to a semiconductor power module comprising at least two sub modules, sub module including at least one respective transistor having a collector, an emitter, and a gate, and a connection arrangement. The connection arrangement comprises a collector terminal unit for connecting the collectors of the at least two sub modules collectively to external circuit components. At least two emitter terminal units for connecting the respective emitters of the at least two sub modules individually to external circuit components and at least two gate terminal units for connecting the respective gates of the at least two sub modules individually to external circuit components.

Another exemplary embodiment is directed to a method for connecting a semiconductor power module that includes at least two sub modules, the sub modules having at least one respective transistor having a collector, an emitter, and a gate, and a connection arrangement, to external circuit components. The method comprises connecting the collectors of the at least two sub modules collectively to the external circuit components by means of a collector terminal. Connecting the respective emitters of the at least two sub modules individually to the external circuit components by means of at least two emitter terminal units and connecting the respective gates of the at least two sub modules individually to the external circuit components by means of at least two gate terminal units.

BRIEF DESCRIPTION OF THE DRAWINGS

A full and enabling disclosure of the present disclosure, including the best mode thereof, to one of ordinary skill in the art is set forth more particularly in the remainder of the specification including reference to the accompanying drawings wherein:

FIG. 7($b$) illustrates a cross section of the semiconductor power module having a gate unit connection in case of two gate emitter pairs in accordance with an exemplary embodiment;

FIG. 8($b$) illustrates collector currents of individual modules with imbalance compensation in accordance with an exemplary embodiment.

DETAILED DESCRIPTION

Figure 1:
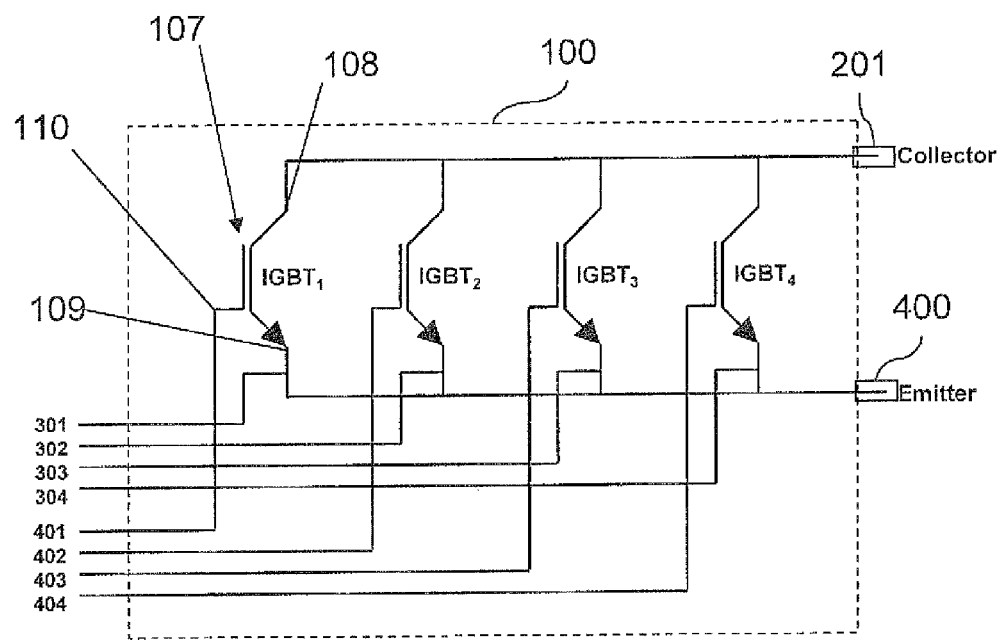
FIG. 1 illustrates a circuit diagram of a semiconductor power module having four IGBTs connected in parallel in accordance with an exemplary embodiment.

It is thus an object to provide a semiconductor power module with improved current ratings.

In view of the above, an exemplary semiconductor power module includes at least two sub modules. The sub modules including at least one respective transistor having a collector, an emitter and a gate, and a connection arrangement. The connection arrangement including a collector terminal unit adapted for connecting the collectors of the at least two sub modules collectively to external circuit components, at least two emitter terminal units adapted for connecting the respective emitters of the at least two sub modules individually to external circuit components, and at least two gate terminal units adapted for connecting the respective gates of the at least two sub modules individually to external circuit components.

According to another exemplary method for connecting a semiconductor power module including at least two sub modules. The sub modules including at least one respective transistor having a collector, an emitter and a gate, and a connection arrangement, to external circuit components is provided. The method including the steps of connecting the collectors of the at least two sub modules collectively to the external circuit components by means of a collector terminal unit, connecting the respective emitters of the at least two sub modules individually to the external circuit components by means of at least two emitter terminal units, and connecting the respective gates of the at least two sub modules individually to the external circuit components by means of at least two gate terminal units.

Reference will now be made in detail to the various exemplary embodiments, one or more examples of which are illustrated in the drawings. Each example is provided by way of explanation and is not meant as a limitation. For example, features illustrated or described as part of one embodiment can be used on or in conjunction with other embodiments to yield yet a further embodiment. It is intended that the present disclosure includes such modifications and variations.

A number of embodiments will be explained below. In this case, identical structural features are identified by identical reference symbols in the drawings. The structures shown in the drawings are not depicted true to scale but rather serve only for the better understanding of the embodiments.

An exemplary semiconductor power module provides the physical containment for several power components such as power transistors. The power components may be arranged on a common substrate, or on a common circuit board, such that a compact electronic circuit arrangement is provided. The semiconductor power module may be defined by the power range which can be handled by the module, e.g. by a supported collector current preferably of more than 100 A or 150 A, for example. In an exemplary embodiment electronic components of semiconductor power modules can be arranged on AlSiC (aluminium silicium carbide) base plates and/or AlN (aluminium nitride) ceramic substrates. Such kind of modules are known under the name HiPak modules.

Furthermore, a semiconductor power module can include several sub modules. Here, the term "sub module" defines a circuit arrangement within a semiconductor power module, wherein the sub modules themselves can each include at least one respective transistor. In particular, a circuit arrangement with a single transistor can be regarded as a sub module. A collector, an emitter and a gate of this transistor(s) of the sub-module can be connected to respective collector, emitter and gate terminal units.

A sub module can be defined as a circuit arrangement of the semiconductor power module comprising at least one transistor. For example, a sub module within a semiconductor power module can be defined by having a common gate and/or emitter terminal (e.g. common for the sub module, such that all transistor(s) of the sub module are/is connected to the same common gate terminal, and/or to the same emitter terminal). Thus, the sub module can be a transistor or can comprise a grouping of at least two transistors. In the case of the sub module comprising at least two transistors, the transistors can have similar electrical characteristics such as a similar current sharing behaviour.

FIG. 1 illustrates a circuit diagram of a semiconductor power module having four IGBTs connected in parallel in accordance with an exemplary embodiment.

As shown in FIG. 1, four transistors 107, which are provided as IGBTs ($ICBT_1$, $IGBT_2$, $IGBT_3$ and $IGBT_4$), can be connected in parallel in order to provide a high current rating. The collectors 108 of the individual transistors 107 can be connected to each other and connected to a collector terminal unit 201. The gates 110 of the individual transistors 107 can be connected individually to gate terminal units 401, 402, 403 and 404, respectively.

Furthermore, the emitters 109 of the individual transistors 107 can be connected individually to emitter terminal units 301, 302, 303 and 304, respectively. For example, the emitters can be connected individually to respective emitter terminal units so that there is one emitter terminal unit per emitter and assigned to that emitter. The emitter terminal unit 301 can be assigned to the emitter of $IGBT_1$, in that the emitter terminal unit 301 can have short path and hence a direct response to the emitter of $IGBT_1$, with substantially low stray inductance. An individual terminal unit per emitter should not exclude the feature in which the terminal unit can also connected indirectly, e.g. with a longer path and larger stray inductance, to other emitters (e.g. by the connection of terminal unit 301 indirectly also to other emitters via the emitter terminal unit 400). This feature can be implemented when the terminal unit 301 is individually assigned to $IGBT_1$.

The collector terminal unit 201, the gate terminal units 401, 402, 403 and 404, and the emitter terminal units 301, 302, 303 and 304 can be provided as connection pins, for example, adapted for a connection to external circuit units. Further examples of a collector terminal unit can include terminal lands, terminal bars, and terminal pads or other suitable connecting component or scheme as desired. In exemplary embodiments, the terminal unit can be fixedly connected to a housing of the power module.

The emitter of the fourth transistor $IGBT_4$ can be connected to a common emitter terminal unit 400. Thus the circuit arrangement shown in FIG. 1 can provide an individual connection of the gates of the transistors 107 of the semiconductor power module to external circuit units. Furthermore, the circuit arrangement shown in FIG. 1 can provide an individual connection of the emitters of the transistors 107 of the semiconductor power module 100 to external circuit units. By controlling the gates and the emitters of the individual transistors 107 it can be possible to compensate a current imbalance resulting from asymmetric DC paths, stray inductances, transistor mismatching and complex electromagnetic coupling effects. Thus, for each transistor 107 a gate-emitter pair can be available for connection to external circuit units. It can be possible to apply dedicated gate control circuitry in order to actively or passively mitigate current imbalance.

As shown in FIG. 1, these gate-emitter pairs can be provided at the terminals 301/401, 302/402, 303/403 and 304/404, respectively. Furthermore, a common emitter terminal unit 400, which is connected to the emitter terminal of the fourth transistor $IGBT_4$ can be provided. The collectors of all transistors can be connected to each other and connected to a collector terminal unit 201. Thus, the collectors 108 of the individual transistors 107 can be connected at a single pin 201, whereas the emitters 109 and the gates 110 of the individual transistors can be individually connectable to external circuit units via the individual emitter terminal units 301-304 and the individual gate terminal units 401-404.

In addition to the circuit arrangement shown in FIG. 1 wherein gate-emitter pairs of all transistors 107 (IGBTs) in a power module 100 can be individually connectable to external circuit units, it can be possible to group transistors having mutually similar or the same electrical characteristics, into sub modules 101, 102 having at least one transistor within an individual sub module.

As provided in the present disclosure, the term "mutually similar or the same electrical characteristics" can denote that a similar current sharing behavior. Further electrical characteristics which can be approximately the same include an emitter-collector drop voltage, a temperature-dependent current, or other suitable electrical characteristics as desired. The term "similar" means a variation of less than 20%, for example, in any or all of these parameters.

In exemplary embodiments of the present disclosure, it can be possible to have the following semiconductor power module designs:

(i) gate-emitter pairs of all IGBTs in a semiconductor power module 100 can individually connectable to external circuit components;

(ii) gate-emitter pairs of each sub module within a power module 100 can be individually connectable to external circuit components; and (iii) a gate-emitter pairs of IGBT groups, of which the current sharing behavior is known to be mutually similar or the same, can be individually connectable to external circuit components.

Figure 2:
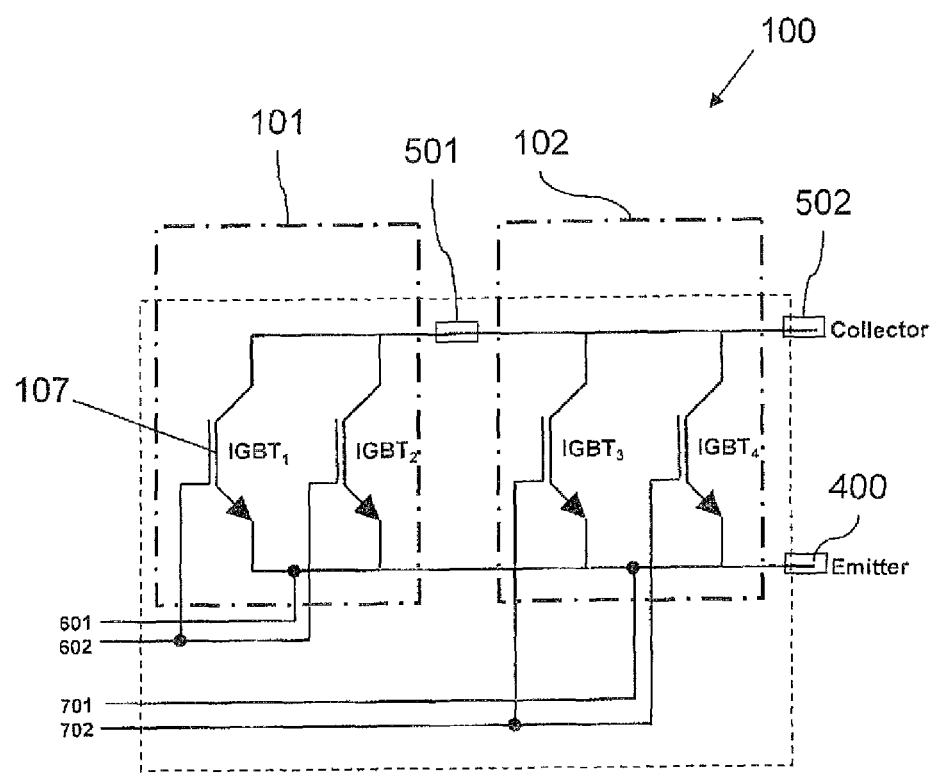
FIG. 2 illustrates a circuit diagram of a semiconductor power module having four IGBTs, wherein two IGBTs are respectively grouped in two respective sub modules in accordance with an exemplary embodiment.

FIG. 2 illustrates a circuit diagram of a semiconductor power module having four IGBTs, wherein two IGBTs are respectively grouped in two respective sub modules in accordance with an exemplary embodiment. As shown in FIG. 2 the IGBTs of FIG. 1 can be grouped into sub modules 101 and 102. The transistors $IGBT_1$ and $IGBT_2$ can be grouped into a sub module 101, wherein the transistors $IGBT_3$ and $IGBT_4$ can be grouped into a sub module 102. The sub modules 101, 102 can be connected by a sub module collector terminal unit 501 which can also be connected to another sub module collector terminal unit 502.

The emitter terminal unit 400 can be connected to both the emitter of the transistor $IGBT_3$ and the emitter of the transistor $IGBT_4$.

As a variance of the exemplary circuit arrangement shown in FIG. 1, the exemplary circuit arrangement shown in FIG. 2 can have two emitter terminal units, two gate terminal units, and two sub modules 101, 102, e.g., a sub module emitter terminal unit 601 and sub module gate terminal unit 602 for the sub module 101, and a sub module emitter terminal unit 701 and a sub module gate terminal unit 702 for the second sub module 102. The sub module emitter terminal units 601, 701 and the sub module gate terminal units 602, 702 can be provided as connection pins adapted for a connection to external circuit units, or as terminal lands, terminal bars, terminal pads or other suitable connection components or schemes as desired and as described above.

Each of the sub modules 101, 102 or other suitable connection components or schemes as desired and can include a sub module connection arrangement, wherein the sub module connection arrangement can include a sub module collector terminal unit 501, 502 adapted for connecting the respective collectors of the at least two transistors 107 of the sub module collectively to external circuit components. For example, the terminal unit can provide a common connection for the collectors of the transistors of the sub module to the outside, where the common connection can be connected in parallel and in a similar manner to all the collectors. A sub module emitter terminal unit 701, 702 can be adapted for connecting the respective emitters 109 (FIG. 1) of the at least two transistors $IGBT_1$, $IGBT_2$ of the sub module 101, 102 collectively to external circuit components, and a sub module gate terminal unit 602, 702 can be adapted for connecting the respective gates 110 (FIG. 1) of the at least two transistors 107 (IGBT) of the sub module 101, 102 collectively to external circuit components.

In an exemplary embodiment the at least two sub modules 101, 102 of the power module 100 can each comprise transistors 107 having mutually similar or the same electrical characteristics. According to another exemplary embodiment the semiconductor power module 100 can include six sub modules 101, 102, 103, 104, 105 and 106, as will be described in detail herein below with respect to FIG. 5.

In another exemplary embodiment transistors having mutually similar or the same electrical characteristics can be grouped into respective sub modules, such that each sub module e.g., group of transistors has a connection arrangement which comprises a sub module collector terminal unit 501, 502 adapted for connecting the collector terminal units of the at least two sub modules 101-106 collectively to external circuit components, a sub module emitter terminal unit 601, 701 adapted for connecting the at least two emitter terminal units of the at least two sub modules 101-106 individually two external circuit components, and a sub module gate terminal unit 602, 702 adapted for connecting the at least two gate terminal units of the at least sub modules 101-106 individually to external circuit components.

In an exemplary embodiment the at least two transistors in a sub module 101-106 can be formed as insulated gate bipolar transistors (IGBTs). Furthermore it can be possible to provide the at least two transistors of a sub module 101-106 as bipolar transistors. As provided in the present disclosure, the bipolar transistor can be provided with a gate, e.g. in case of an insulated gate bipolar transistor (IGBT), the gate can also be referred to as a base.

As shown in FIG. 2, the terminal units can be provided as a first gate-emitter pair 601/602, and a second gate-emitter pair 701/702. More generally, the terminal units can be grouped into emitter-gate terminal pairs. The emitter-gate terminal pairs of the at least two transistors 107 within a sub module 101-106 of the semiconductor power module 100 can be provided individually. An emitter-gate terminal pair of a sub module 101-106 of the semiconductor power module 100 can be provided individually, wherein the emitters of the at least two transistors within the sub module 101-106 can be connected to each other and the gates 110 of the at least two transistors 107 within the sub module 101-106 can be connected to each other.

Furthermore, it can be possible to provide an emitter-gate terminal pair of a group of transistors 107 having a mutually similar or the same current sharing behavior individually, wherein the emitters of the group of transistors having a mutually similar or the same current sharing behavior can be connected to each other and the gates of the group of transistors having a mutually similar or the same current sharing behavior can be connected to each other.

Figure 3:
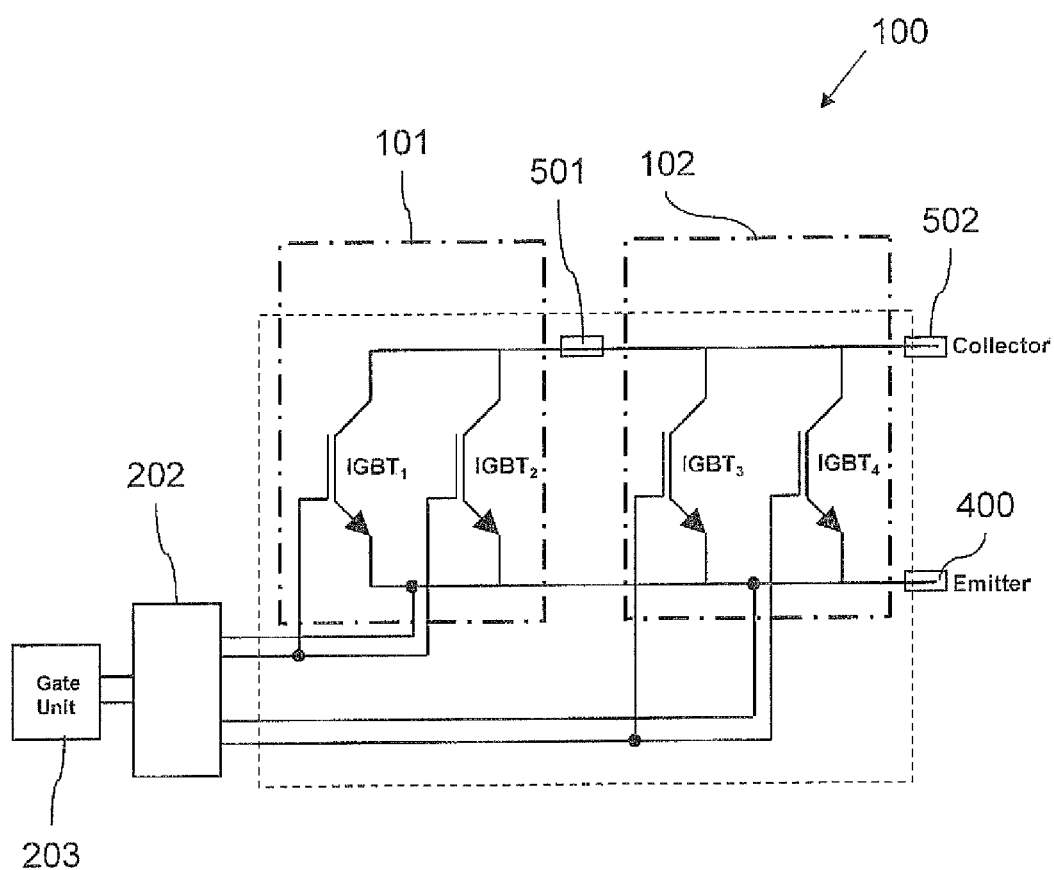
FIG. 3 illustrates a circuit arrangement of a semiconductor power module having a balancing unit connected to emitter terminal units and gate terminal units of the semiconductor power module in accordance with an exemplary embodiment.

FIG. 3 illustrates a circuit arrangement of a semiconductor power module having a balancing unit connected to emitter terminal units and gate terminal units of the semiconductor power module in accordance with an exemplary embodiment. FIG. 3 shows a circuit arrangement wherein two sub modules 101 can be provided within a semiconductor power module 100 as in FIG. 2 described herein above. It should be understood that circuit components and parts which have been described with respect to previous figures are not detailed in the following figures in order to avoid an overlapping description. In addition to the circuit arrangement described with respect to FIG. 2 above, the circuit arrangement shown in FIG. 3 can include a balancing unit 202 and a gate unit 203 which are connected to the sub module emitter terminal unit 601, 701 and the sub module gate terminal unit 602, 702 shown in FIG. 2. A current balancing between the sub modules 101 and 102 of the semiconductor power module 100 shown in FIG. 3 can provide a current balance between the two sub modules 101, 102. The gate unit 203 can be provided for a gating the semiconductor power module 100 including the two sub modules 101 and 102.

Figure 4:
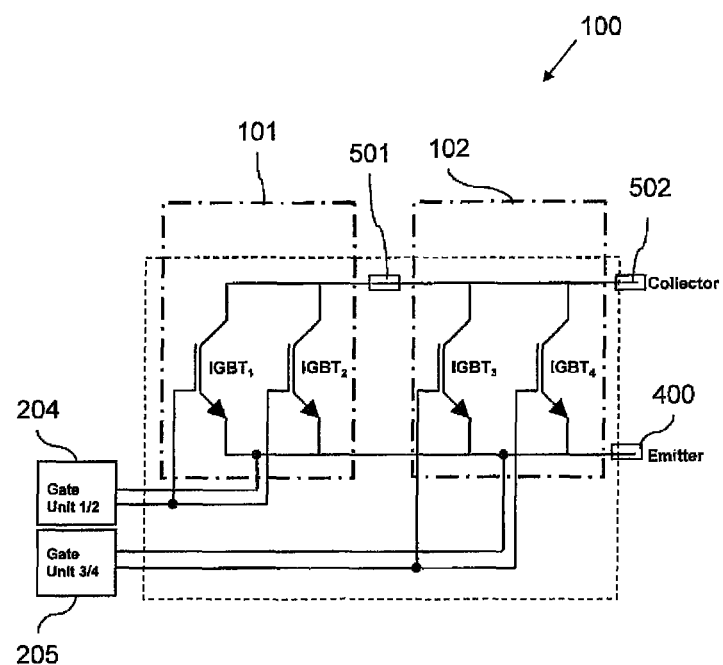
FIG. 4 illustrates a circuit configuration of a semiconductor power module, having two separate gate units used for current balancing, in accordance with an exemplary embodiment.

In an exemplary embodiment and as a variance to providing a single gate unit 203 for gating the sub modules 101 and 102 of the semiconductor power module 100 it can be possible to provide two separate gate units, e.g. a first gate unit 204 and a second gate unit 205. FIG. 4 illustrates a circuit configuration of a semiconductor power module, having two separate gate units used for current balancing, in accordance with an exemplary embodiment. The additional circuit components shown in FIG. 4 encompass like features of the circuit component shown in FIG. 3 such that a description thereof is omitted here. In FIG. 4 the two separate gate units, e.g. a first gate unit 204 and a second gate unit 205 can be used for individually controlling the transistors connected in parallel of the two sub modules 101 and 102.

Figure 5:
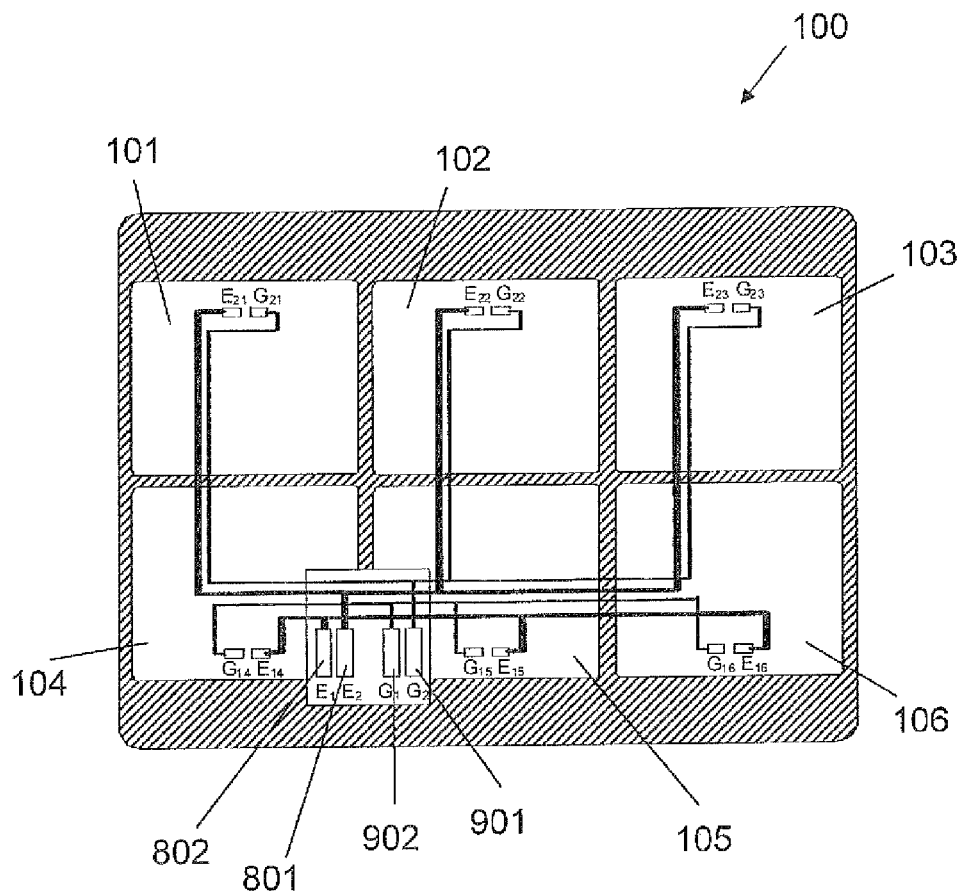
FIG. 5 illustrates a top view of a semiconductor power module which includes six sub modules and a connection arrangement in accordance with an exemplary embodiment.

FIG. 5 illustrates a top view of a semiconductor power module which includes six sub modules and a connection arrangement in accordance with an exemplary embodiment. For example, FIG. 5 is a schematic view of a semiconductor power module 100 having six sub module portions 101, 102, 103, 104, 105 and 106. As shown in FIG. 5 each of the sub module portions 101 to 106 can be a transistor or comprises at least one transistor and behaves substantially as a transistor, i.e. has a gate, emitter, and collector terminal. In the case of the sub module portion 1, the emitter terminal is given as E21, the gate terminal is given as G21, the collector terminal is not shown. These terminals of the six sub module portions 101-106 can be connected to the outside of the power module by means of two separate gate-emitter terminal pairs $E_1$, $E_2$ and $G_1$, $G_2$, respectively: gate-emitter terminal pair $E_1$, $G_1$ can connect the gates of the three lower sub module portions 104 to 106 to the outside, whereas gate-emitter terminal pair $E_2$, $G_2$ can connect the gates of the three upper sub module portions 101 to 103 to the outside. The collectors (not shown) of all six sub-module portions can be connected collectively to the outside. In this manner, the group of the three upper sub module portions 101 to 103 can have a common gate terminal $G_2$ and a common emitter terminal $E_2$ and can therefore be regarded as a sub-module according to the definition of a sub-module that follows.

The semiconductor power module can be grouped into sub modules. The sub modules can have mutually similar electrical characteristics. As described above, a sub module comprise at least one transistor. As provided in the present disclosure, a sub module can include an electrical circuit arrangement having a common gate and/or emitter terminal for the at least one transistor. Herein, in the context of an exemplary sub module having only one single transistor, the "common" terminal can be the terminal of this transistor.

Each sub module can have a connection arrangement that includes a sub module collector terminal unit adapted for connecting the collector terminal units of the at least two sub modules collectively to external circuit components (e.g., collective for the sub modules, such that one common collector signal is applied to all of the sub modules via this terminal unit), a sub module emitter terminal unit adapted for connecting the at least two emitter terminal units of the at least two sub modules individually to external circuit components such that individual emitter signals can be applied to the respective sub modules via this terminal unit, and a sub module gate terminal unit adapted for connecting the at least two gate terminal units of the at least two sub modules individually to external circuit components such that individual gate signal can be applied to the respective sub modules via this terminal unit.

As shown in FIG. 5 the upper upper three sub module portions 101, 102 and 103 can be connected in parallel with respect to their gate terminal units and their emitter terminal units, e.g., the emitter terminals of the three sub module portions 101-103 ($E_{21}$, $E_{22}$ and $E_{23}$) can be connected to each other, and the three gate terminal units of the three upper sub module portions 101-103 ($G_{21}$, $G_{22}$ and $G_{23}$) can be connected to each other. The emitters of the three upper sub module portions 101, 102 and 103 can be connected to an upper emitter terminal unit 801 (e.g., emitter terminal unit $E_2$ of the upper sub module comprising (e.g., consisting of) the sub module portions 101-103), and the gates of the three upper sub module portions 101-103 ($G_{21}$, $G_{22}$, $G_{23}$) can be connected to a upper gate terminal unit 901 (gate terminal unit $G_2$ of the upper sub module comprising (e.g., consisting of) the sub module portions 101-103).

In a similar manner the lower sub module portions 104-106 each including at least one transistor can be connected to each other. The emitters of the lower sub module portions 104-106 ($E_{14}$, $E_{15}$, $E_{16}$) can be connected to each other and connected to a lower emitter terminal unit 802 (e.g., emitter terminal unit $E_1$ of the lower sub module consisting of the sub module portions 104-106), and the gates of the lower sub module portions 104-106 ($G_{141}$, $G_{15}$, $G_{16}$) can be connected to each other and to a lower gate terminal unit 902 (e.g., gate terminal unit $G_1$ of the lower sub module consisting of the sub module portions 104-106). The arrangement shown in FIG. 5 thus enable the grouping of sub module portions having at least one transistor and having mutually similar electrical characteristics into sub modules. Thus a current imbalance between the upper sub module 101-103 and the lower sub module 104-106 can be eliminated by an individual control of gate and emitter terminal units ($G_1$, $E_1$, and $G_2$, $E_2$, respectively).

Figure 6:
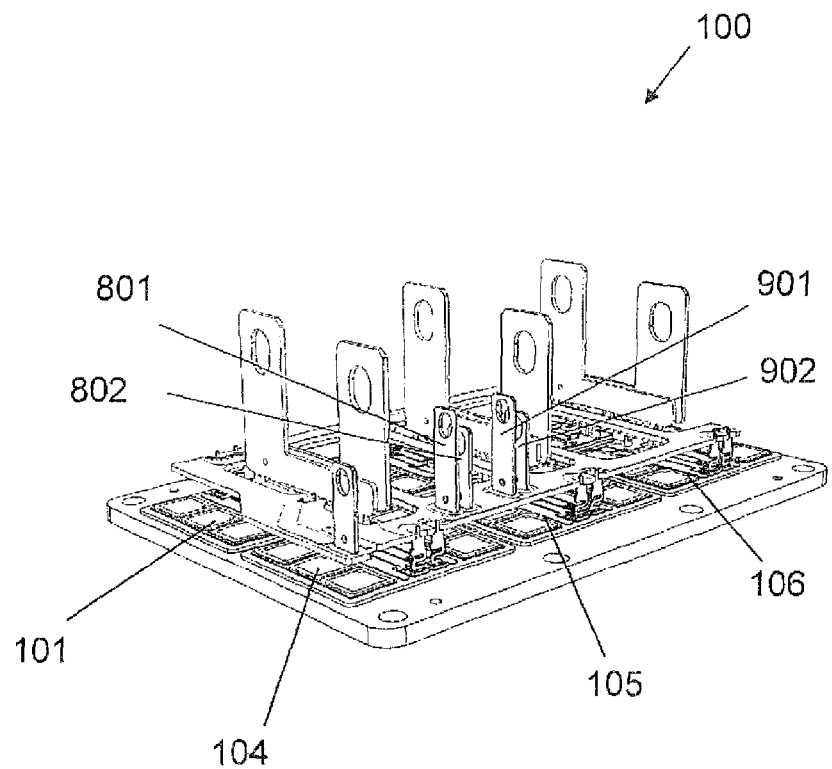
FIG. 6 illustrates a perspective view of a connection arrangement for a semiconductor power module having six sub modules, in accordance with an exemplary embodiment.

FIG. 6 illustrates a perspective view of a connection arrangement for a semiconductor power module having six sub modules, in accordance with an exemplary embodiment. In particular, FIG. 6 is a perspective view of a terminal setup of a semiconductor power module 100 having six sub module portions 101, 102, 103, 104, 105 and 106 as shown in FIG. 5. Different terminal units can be adapted for a connection to external circuit components. Two gate-emitter terminal pairs are shown in FIG. 6, i.e. a first gate-emitter terminal pair including an upper emitter terminal unit 801 and an upper gate terminal unit 901, and a second gate-emitter terminal pair including a lower emitter terminal unit 802 and a lower gate terminal unit 902.

The terminal setup shown in FIG. 6 can provide an individual connection of two sub modules (e.g., upper sub module and lower sub module, as shown in FIG. 5). Here, for example, the upper emitter terminal unit 801 can be assigned to the upper sub module 101, 102, 103, wherein the lower emitter terminal unit 802 can be assigned to the lower sub module 104, 105, 106. Likewise, the upper gate terminal unit 901 can be assigned to the upper sub module 101, 102, 103, wherein the lower gate terminal unit 902 can be assigned to the lower sub module 104, 105, 106.

As shown in the perspective view of FIG. 6, the upper emitter terminal unit 801, the lower emitter terminal unit 802, the upper gate terminal unit 901 and the lower gate terminal unit 902 can be accessed separately for a separate connection of the upper sub module of the power module 100 and the lower sub module of the semiconductor power module 100, respectively. This gate-emitter terminal concept is applicable where a current imbalance between the upper sub module and the lower sub module of the semiconductor power module 100 may occur.

It is a general aspect that the emitter terminal units of different sub modules can be of mutually different shape, as is illustrated in FIG. 6 (wherein e.g., the upper and lower emitter terminal units 801 and 802 are of mutually different shape). Likewise, the collector and/or gate terminal units of different sub modules can be of mutually different shape. This feature can allow for a design of the terminal units that fit at least partially into existing power module sockets.

Figure 7:
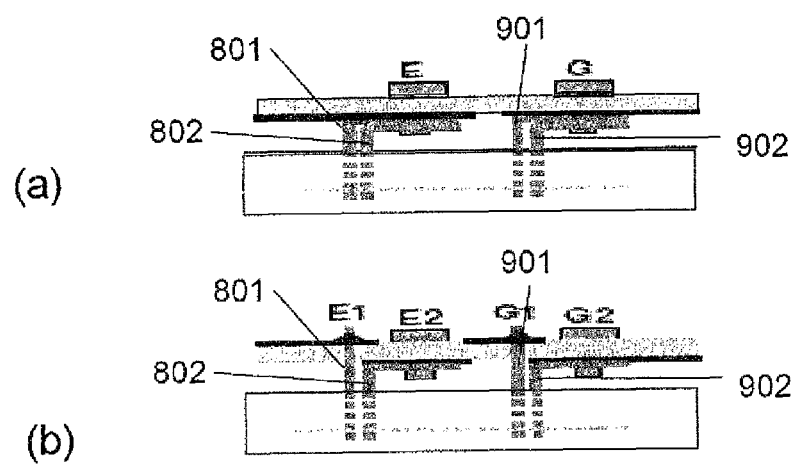
FIG. 7($a$) illustrates a cross section of the semiconductor power module having a standard gate unit connection in case of the single gate emitter pair in accordance with an exemplary embodiment.

FIG. 7(a) illustrates a cross section of the semiconductor power module having a standard gate unit connection in case of the single gate emitter pair in accordance with an exemplary embodiment. FIG. 7(a) is a cross section of a connection arrangement of the upper emitter terminal unit 801, the lower emitter terminal unit 802, the upper gate terminal unit 901 and the lower gate terminal unit 902 to external circuit components via a terminal connection E and a terminal connection G, respectively. In the arrangement shown in FIG. 7(a) the separate emitter terminal units and the separate gate terminal units can be connected to each other (e.g., outside of the power module itself, in which the gate/emitter terminal units are connected individually to the sub modules), in order to be compatible to circuit arrangements where a separate connection of emitters and gates, respectively, of a specific sub module (or transistor) is not desired.

Figure 8:
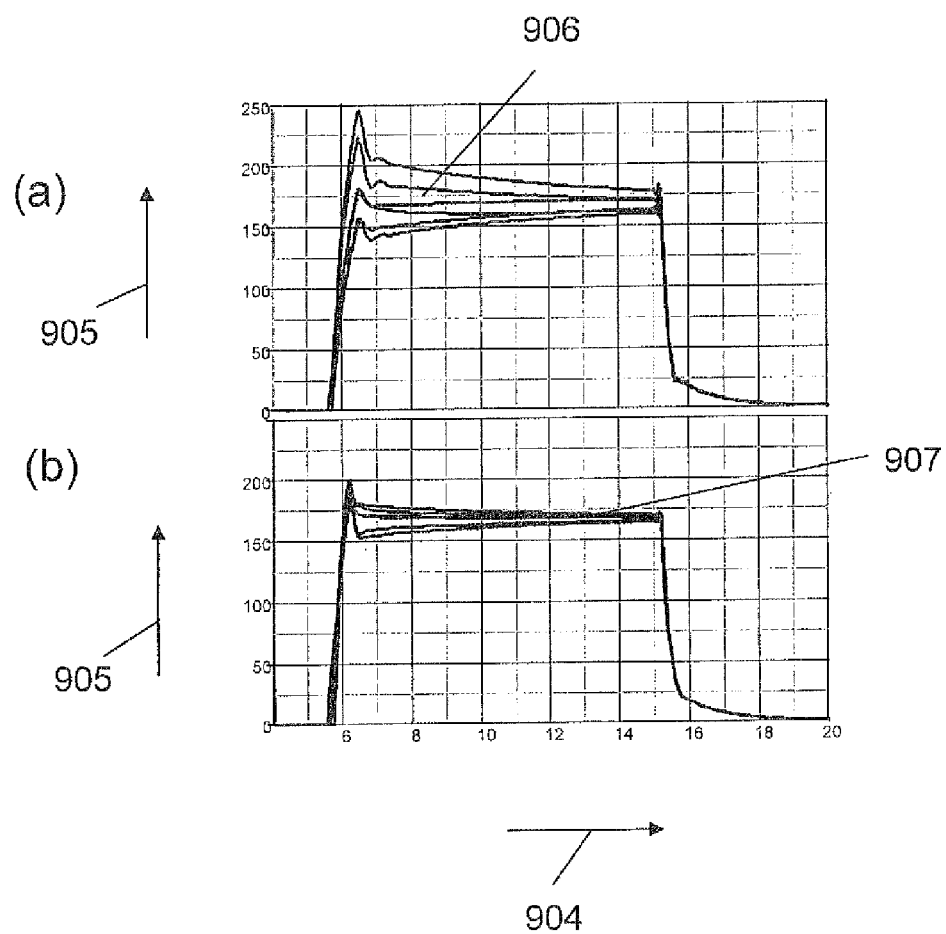
FIG. 8($a$) illustrates a graph showing collector currents of individual sub modules without imbalance compensation in accordance with an exemplary embodiment.

For example, FIG. 8(a) illustrates a graph showing collector currents of individual sub modules without imbalance compensation in accordance with an exemplary embodiment. As a variance to the exemplary arrangement shown in FIG. 7(a), FIG. 7(b) exhibits individual connection of individual emitter terminal units 801, 802 and gate terminal units 901, 902. In the arrangement shown in FIG. 7(b) separate emitters (E1, E2) and separate gates (G1, G2) of upper row of sub modules and a lower row of sub modules of the semiconductor power module 100 or of individual transistors can be provided.

FIGS. 8(a) and 8(b) are diagrams showing collector currents 905 as a function of time 904. For example, FIG. 8(b) illustrates collector currents of individual modules with imbalance compensation in accordance with an exemplary embodiment. Here the collector currents of different transistors or sub modules, respectively shown in FIG. 8(a) correspond to an arrangement where no individual gate-emitter terminal pairs are provided, e.g. FIG. 8(a) shows collector currents 905 wherein individual sub module currents 906 are shown without imbalance compensation, wherein the arrangement shown in FIG. 8(b) corresponds to an individual gate-emitter terminal connection, e.g. to such a connection as it is shown in FIG. 7(b).

As shown in the diagrams of FIGS. 8(a) and 8(b), individual sub module currents with imbalance compensation (FIG. 8(b)) differ much less than individual sub module currents without imbalance compensation 906 (see FIG. 8(a)). The curves shown in FIGS. 8(a) and 8(b) result from a simulation without (FIG. 8(a)) and with (FIG. 8(b)) passive current balance arrangement.

Figure 9:
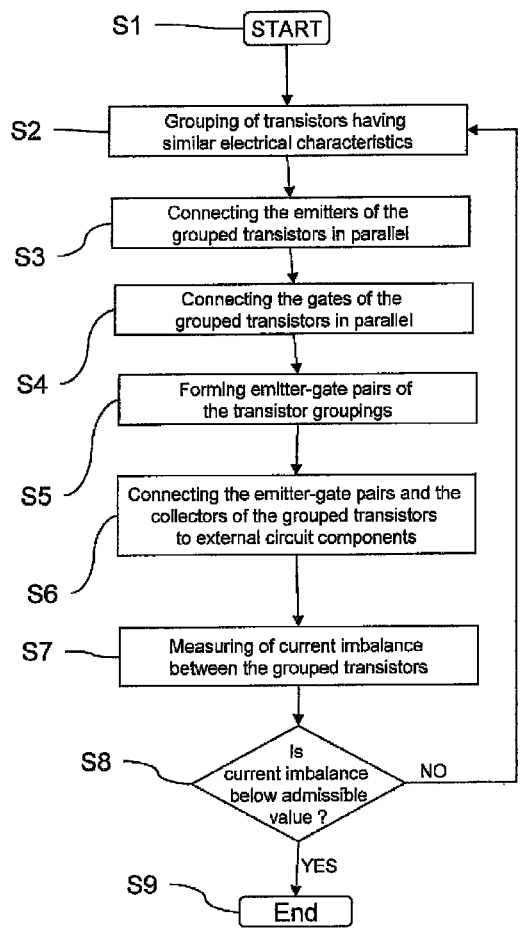
FIG. 9 is a flowchart of a method for connecting a semiconductor power module to external circuit components in accordance with an exemplary embodiment.

FIG. 9 is a flowchart of a method for connecting a semiconductor power module to external circuit components in accordance with an exemplary embodiment. FIG. 9 is a flowchart illustrating a method for connecting a semiconductor power module to external circuit units.

At a step S1 the procedure is started. At a step S2 transistors having mutually similar electrical characteristics are grouped within the semiconductor power module. It is noted that the transistors can be additionally grouped into sub modules, as illustrated herein above.

In a step S3, the emitters of the grouped transistors are connected in parallel, e.g. the emitters of the grouped transistors are connected to each other and to an emitter terminal unit of a respective sub module. Then, at a step S4 respective gates of the group transistors are connected to each other.

At a step S5, emitter-gate terminal pairs of the transistor groupings are formed. At a step S6 the emitter-gate terminal pairs of the collectors of the grouped transistors are connected to external circuit units. Then the current imbalance between the grouped transistors is measured at a step S7. At a step S8 it is determined, whether the current imbalance is below an admissible value or not. If the current imbalance is above an admissible value ("no" at the step S8), the procedure returns to the step S2 and the steps S2 to S7 are repeated.

If it is determined at step S8, that the current imbalance is below an admissible value ("Yes" at the step S8), then the procedure is ended at a step S9. It is noted that the emitter terminal units adapted for connecting the emitters for the at least two transistors of a sub module can be combined within a single sub module. Furthermore it can be possible to combine the gate terminal units adapted for connecting the gates of the at least two transistors of a sub module within a single sub module.

Furthermore, both the emitter terminal units and the gate terminal units of a sub module can be provided independently within the semiconductor power module.

The disclosure has been described on the basis of embodiments which are shown in the appended drawings and from which further advantages and modifications emerge. However, the disclosure is not restricted to the embodiments described in concrete terms, but rather can be modified and varied in a suitable manner. It lies within the scope of the disclosure to combine individual features and combinations of features of one embodiment with features and combinations of features of another embodiment in a suitable manner in order to arrive at further embodiments.

It will be apparent to those skilled in the art, based upon the teachings herein, that changes and modifications may be made without departing from the disclosure disclosed and its broader aspects. That is, all examples set forth herein above are intended to be exemplary and non-limiting.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A semiconductor power module comprising:
   at least two sub modules, each sub module including at least one respective transistor having a collector, an emitter, and a gate; and
   a connection arrangement, wherein said connection arrangement comprises:
      a collector terminal unit for connecting the collectors of the at least two sub modules collectively to external circuit components;
      at least two emitter terminal units for connecting the respective emitters of the at least two sub modules individually to external circuit components; and
      at least two gate terminal units for connecting the respective gates of the at least two sub modules individually to external circuit components,
      wherein sub units having mutually similar electrical characteristics are grouped into a respective group of sub units, wherein each group of sub units has a respective connection arrangement comprising:
         a sub module group collector terminal unit for connecting the collector terminal units of the sub modules of the group collectively to external circuit components;

a sub module group emitter terminal unit for connecting the at least two emitter terminal units of the sub modules of the group individually to external circuit components; and a sub module group gate terminal unit for connecting the at least two gate terminal units of the at least two sub modules of the group individually to external circuit components.

2. The semiconductor power module in accordance with claim 1, wherein the at least one respective transistor is an Insulated Gate Bipolar Transistor.

3. The semiconductor power module in accordance with claim 1, wherein the at least one respective transistor is a bipolar transistor.

4. The semiconductor power module in accordance with claim 1, wherein each sub module includes emitter-gate terminal pairs.

5. The semiconductor power module in accordance with claim 1,
wherein each sub module includes an emitter-gate terminal pair, and
wherein emitters of at least two transistors within the sub module are connected to each other and gates of the at least two transistors within the sub module are connected to each other.

6. The semiconductor power module in accordance with claim 1, comprising:
an emitter-gate terminal pair of a group of transistors having a mutually similar current sharing behavior, wherein the emitters of the group of transistors having a mutually similar current sharing behavior are connected to each other, and wherein the gates of the group of transistors having a mutually similar current sharing behavior are connected to each other.

7. A semiconductor power module comprising:
at least six sub modules, each sub module including at least one respective transistor having a collector, an emitter, and a gate; and
a connection arrangement, wherein said connection arrangement comprises:
a collector terminal unit for connecting the collectors of the at least two sub modules collectively to external circuit components;
at least two emitter terminal units for connecting the respective emitters of the at least two sub modules individually to external circuit components; and
at least two gate terminal units for connecting the respective gates of the at least two sub modules individually to external circuit components.

8. A semiconductor power module comprising:
at least two sub modules, each sub module including at least one respective transistor having a collector, an emitter, a gate, and emitter-gate terminal pairs; and
a connection arrangement, wherein said connection arrangement comprises:
a collector terminal unit for connecting the collectors of the at least two sub modules collectively to external circuit components;
at least two emitter terminal units for connecting the respective emitters of the at least two sub modules individually to external circuit components; and
at least two gate terminal units for connecting the respective gates of the at least two sub modules individually to external circuit components.

9. The semiconductor power module in accordance with claim 8, wherein each of the at least two sub modules includes six individual transistors.

10. The semiconductor power module in accordance with claim 8, wherein each of the at least two sub modules includes a plurality of transistors having mutually similar electrical characteristics.

11. The semiconductor power module in accordance with claim 8, wherein the at least two sub modules includes six sub modules.

12. The semiconductor power module in accordance with claim 8, wherein sub units having mutually similar electrical characteristics are grouped into a respective group of sub units, wherein each group of sub units has a respective connection arrangement comprising:
a sub module group collector terminal unit for connecting the collector terminal units of the sub modules of the group collectively to external circuit components;
a sub module group emitter terminal unit for connecting the at least two emitter terminal units of the sub modules of the group individually to external circuit components; and
a sub module group gate terminal unit for connecting the at least two gate terminal units of the at least two sub modules of the group individually to external circuit components.

13. The semiconductor power module in accordance with claim 8, wherein the at least one respective transistor is an Insulated Gate Bipolar Transistor.

14. The semiconductor power module in accordance with claim 8, wherein the at least one respective transistor is a bipolar transistor.

15. The semiconductor power module in accordance with claim 8, comprising:
an emitter-gate terminal pair of a sub module of the semiconductor power module,
wherein emitters of at least two transistors within the sub module are connected to each other and gates of at least two transistors within the sub module are connected to each other.

16. The semiconductor power module in accordance with claim 8, comprising:
an emitter-gate terminal pair of a group of transistors having a mutually similar current sharing behavior, wherein the emitters of the group of transistors having a mutually similar current sharing behavior are connected to each other, and wherein the gates of the group of transistors having a mutually similar current sharing behavior are connected to each other.

17. A semiconductor power module comprising:
at least two sub modules, each sub module including at least one respective transistor having a collector, an emitter, a gate, and an emitter-gate terminal pair; and
a connection arrangement, wherein said connection arrangement comprises:
a collector terminal unit for connecting the collectors of the at least two sub modules collectively to external circuit components;
at least two emitter terminal units for connecting the respective emitters of the at least two sub modules individually to external circuit components; and
at least two gate terminal units for connecting the respective gates of the at least two sub modules individually to external circuit components,
wherein emitters of at least two transistors within the sub module are connected to each other and gates of at least two transistors within the sub module are connected to each other.

18. The semiconductor power module in accordance with claim 17, wherein sub units having mutually similar electrical characteristics are grouped into a respective group of sub units, wherein each group of sub units has a respective connection arrangement comprising:
- a sub module group collector terminal unit for connecting the collector terminal units of the sub modules of the group collectively to external circuit components;
- a sub module group emitter terminal unit for connecting the at least two emitter terminal units of the sub modules of the group individually to external circuit components; and
- a sub module group gate terminal unit for connecting the at least two gate terminal units of the at least two sub modules of the group individually to external circuit components.

19. The semiconductor power module in accordance with claim 17, wherein the at least one respective transistor is an Insulated Gate Bipolar Transistor.

20. The semiconductor power module in accordance with claim 17, wherein the at least one respective transistor is a bipolar transistor.

21. The semiconductor power module in accordance with claim 17, wherein each sub module includes emitter-gate terminal pairs.

22. The semiconductor power module in accordance with claim 17, comprising:
- an emitter-gate terminal pair of a group of transistors having a mutually similar current sharing behavior, wherein the emitters of the group of transistors having a mutually similar current sharing behavior are connected to each other, and wherein the gates of the group of transistors having a mutually similar current sharing behavior are connected to each other.

23. A semiconductor power module comprising:
- at least two sub modules, each sub module including at least one respective transistor having a collector, an emitter, and a gate;
- an emitter-gate terminal pair of a group of transistors having a mutually similar current sharing behavior, wherein the emitters of the group of transistors having a mutually similar current sharing behavior are connected to each other, and wherein the gates of the group of transistors having a mutually similar current sharing behavior are connected to each other; and
- a connection arrangement, wherein said connection arrangement comprises:
  - a collector terminal unit for connecting the collectors of the at least two sub modules collectively to external circuit components;
  - at least two emitter terminal units for connecting the respective emitters of the at least two sub modules individually to external circuit components; and
  - at least two gate terminal units for connecting the respective gates of the at least two sub modules individually to external circuit components.

24. A semiconductor power module comprising:
- at least two sub modules, each sub module including at least one respective transistor having a collector, an emitter, and a gate, wherein each of the at least two sub modules includes six individual transistors; and
- a connection arrangement, wherein said connection arrangement comprises:
  - a collector terminal unit for connecting the collectors of the at least two sub modules collectively to external circuit components;
  - at least two emitter terminal units for connecting the respective emitters of the at least two sub modules individually to external circuit components; and
  - at least two gate terminal units for connecting the respective gates of the at least two sub modules individually to external circuit components.

* * * * *